US010451674B2

(12) United States Patent
Dani et al.

(10) Patent No.: US 10,451,674 B2
(45) Date of Patent: Oct. 22, 2019

(54) APPARATUS AND METHOD FOR AT-SPEED SCAN TEST

(71) Applicant: Intel Corporation, Santa Clara, CA (US)

(72) Inventors: Dhruv S. Dani, Chandler, AZ (US); Uday Padmanabhan, Chandler, AZ (US); Richard Murphy, Chandler, AZ (US); Aniket Bharaswadkar, Chandler, AZ (US); Boris Razmyslovitch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 15/716,441

(22) Filed: Sep. 26, 2017

(65) Prior Publication Data
US 2018/0203065 A1    Jul. 19, 2018

Related U.S. Application Data

(60) Provisional application No. 62/446,250, filed on Jan. 13, 2017.

(51) Int. Cl.
*G01R 31/317* (2006.01)
*G01R 31/3177* (2006.01)
*G01R 31/3185* (2006.01)

(52) U.S. Cl.
CPC ... *G01R 31/31725* (2013.01); *G01R 31/3177* (2013.01); *G01R 31/31727* (2013.01); *G01R 31/318552* (2013.01)

(58) Field of Classification Search
CPC .... G01R 31/318552; G01R 31/318544; G01R 31/318541; G01R 31/318594; G01R 31/3177; G01R 31/31725; G01R 31/31727
See application file for complete search history.

(56) References Cited

U.S. PATENT DOCUMENTS

| | | | | |
|---|---|---|---|---|
| 8,850,280 B2* | 9/2014 | Tekumalla | ..... | G01R 31/318594 714/731 |
| 2010/0107024 A1* | 4/2010 | Tokunaga | ...... | G01R 31/318552 714/729 |
| 2013/0038371 A1* | 2/2013 | Fernandes | ...... | G01R 31/318552 327/299 |
| 2014/0013173 A1* | 1/2014 | Ramaswami | .. | G01R 31/318544 714/726 |
| 2014/0189452 A1* | 7/2014 | Sonawane | ...... | G01R 31/318552 714/727 |
| 2015/0026532 A1* | 1/2015 | Clouqueur | ..... | G01R 31/318541 714/726 |

* cited by examiner

*Primary Examiner* — Shelly A Chase
(74) *Attorney, Agent, or Firm* — Green, Howard & Mughal LLP.

(57) ABSTRACT

Described is an apparatus which comprises: a circuitry to selectively switch between a functional clock or a scan clock; a first plurality of circuitries to generate a plurality of pulses according to the scan or functional clocks; and a second plurality of circuitries to generate a plurality of clocks according to the plurality of pulses, wherein the plurality of clocks are for testing one or more circuitries.

18 Claims, 9 Drawing Sheets

APPARATUS AND METHOD FOR AT-SPEED SCAN TEST

CLAIM OF PRIORITY

This application claims priority of U.S. Provisional Application having Ser. No. 62/446,250 filed Jan. 13, 2017, which is incorporated by reference in its entirety.

BACKGROUND

Several circuit systems in an integrated circuit (IC) chip use clocks (or clock signals) that have large divide ratios (e.g., divide ratio ranging from 2 to 64), and these divided clocks are generated from a source clock. These various circuit systems are generally tested at their functional clock frequencies (also referred to as at-speed test) to determine proper function of operation. One such set of circuits are transceiver digital signal processing filters that apply clocks generated by one or more clock generators, and these clocks are used by these filters to transmit or receive radio messages. Current solutions for at-speed scan capture are rigid in a sense that they can only be plugged in at a clock source and then generate a fixed number of divided and derived clocks for at-speed scan capture phase. Testing coverage of these various circuits is a challenge because the current at-speed testing architecture cannot handle data transfer between circuit paths clocked or sampled by clocks generated using different divide ratios (e.g., clocks with divide ratios of 16 and 64).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION OF EXEMPLARY EMBODIMENTS

Figure 1:
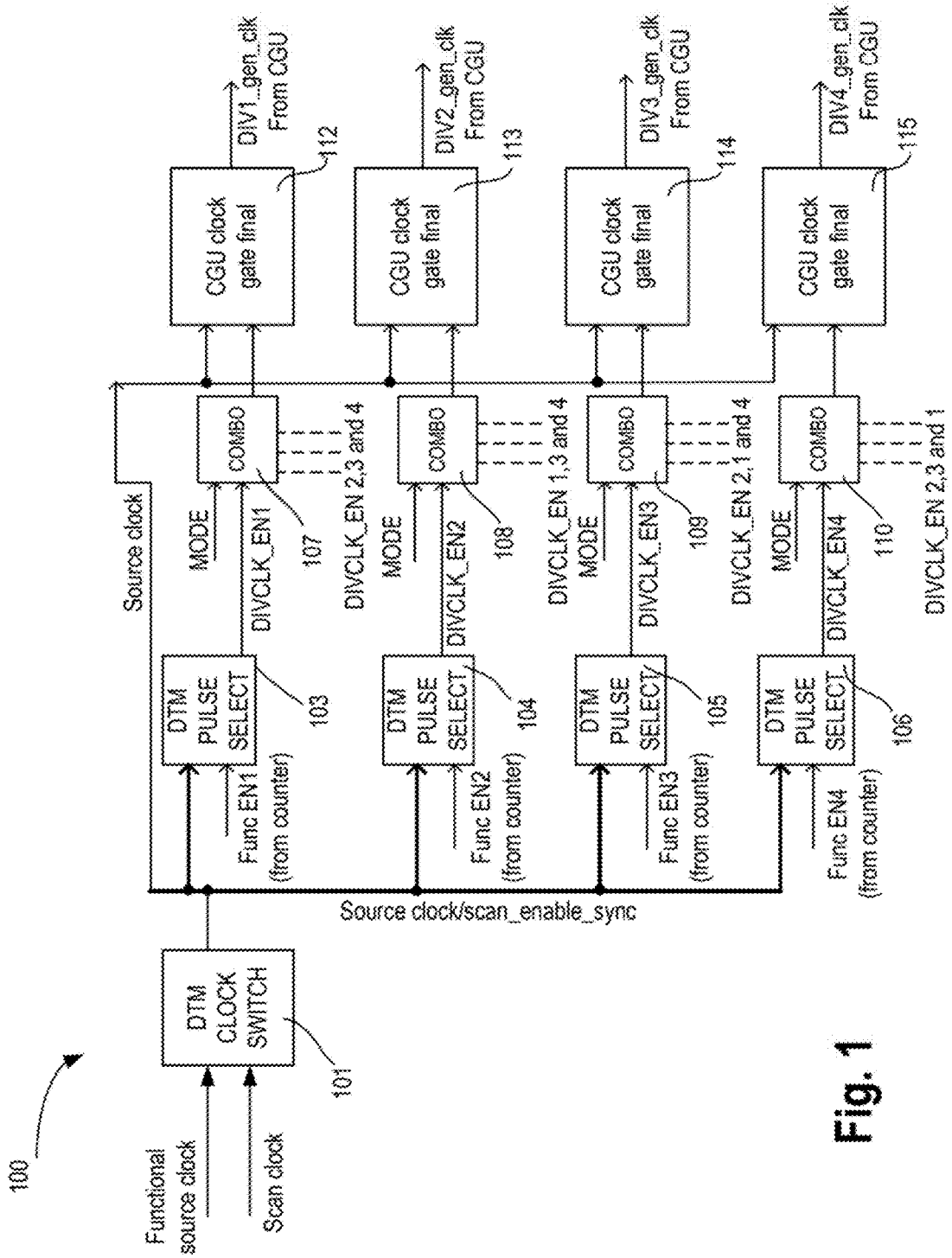
FIG. 1 illustrates an apparatus to generate clocks for at-speed scan shift and capture phases, according to some embodiments of the disclosure.

Some embodiments provide a mechanism to "plug and play" at-speed scan control circuitry to test circuit domains clocked or sampled by divided clocks with different divide ratios and to ensure that up-sampling/down-sampling design intent for the transfer of data is preserved and tested with a good resultant coverage. The term "plug and play" here generally refers to a usage mechanism where at-speed scan control circuitry can scan or test a set of circuits for various testing scenarios. Some embodiments use functional clock generation logic (e.g., phase locked loop) and division logic (e.g., dividers such as Johnson Counters) for the generation of clocks for the at-speed scan test capture cycle. Existing solutions tend to have extra logic to generate capture clocks for at-speed scan, which leads to more power consumption and area. Various embodiments make the "plug and play" logic less area intensive than existing solutions and ensures that the test mechanism tests the generation of functional clocks while performing at-speed scan.

There are several technical effects of the various embodiments. For example, the at-speed scan circuits of various embodiments use less area and lower power than existing solutions and ensure that functional clocks are tested while performing at-speed scan test. In another example, the asynchronous clock domains can be handled properly which add to the overall IC test coverage. For example, the asynchronous clock domains can be handled very efficiently by switching the clocks off (or gating the clocks) for one clock domain while testing another clock domain which is asynchronous to the aforementioned clock domain. As such, less power is consumed by the at-speed scan mechanism. The existing solutions cannot do this efficiently since they do not have this "plug and play" approach which allows the various embodiments the flexibility to turn off/on any number of desired clocks depending on the testing scenario.

The embodiments of the disclosure will be understood more fully from the detailed description given below and from the accompanying drawings of various embodiments of the disclosure, which, however, should not be taken to limit the disclosure to the specific embodiments, but are for explanation and understanding only.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates apparatus 100 to generate clocks for at-speed scan shift and capture phases, according to some embodiments of the disclosure. Apparatus 100 gives full flexibility to "plug and play" at-speed scan (also referred to here as Delay Test Module (DTM_*) blocks) on any derived clock at the output of a clock generating unit (CGU) or clock generator (e.g., phase locked loop). This provides flexibility in covering logic clocked by clocks with several divide ratios of the source clock. Here, the term "covering" generally refers to testing a circuit with a test pattern. As data on more nodes of a circuit are tested, more coverage is achieved for that circuit.

In some embodiments, synchronous clock domains can be handled efficiently by turning on/off clocks at the CGU output to generate data test patterns for a particular clock domain. Here, the term "domain" generally refers to one or more circuits or logic that operate using a common parameter such as power supply or clock. For example, a processor may have multiple clock domains which implies multiple logics operating on separate clocks that may have same or different frequencies.

In some embodiments, turning on/off clocks at the CGU output to generate data test patterns for a particular clock domain, a higher test coverage can be covered efficiently than the already known solutions since the logic clocked or sampled by clocks with different frequencies or domains can be covered efficiently. Another advantage is that this approach emphasizes testing of the functional clock control and the clock divide logic inside the CGU. Unlike current methods in which an at-speed controller generates its own divided clocks, some embodiments make use of a functional clock control circuitry to generate clock pulses at the desired frequency for the at-speed capture phase thus ensuring that the functional clock generation circuitry is implicitly a part of the tested logic.

The test coverage for at-speed scan of various embodiments approaches close to 90% to 95% (e.g., varies due to the differences in design complexity) compared to a 70% to 80% (e.g., varies due to the differences in design complexity) coverage number yielded by instantiating an at-speed controller at the clock source. A better at-speed scan coverage is helpful for giving confidence on the proper functioning of the parts in an IC while performing production tests. Process and voltage scaling exercise is also benefitted by a better at-speed coverage from the various embodiments since the parts (e.g., processor or dies) being tested can be tested or swept over a spectrum of different process and voltage corners using at-speed test patterns, and a higher coverage gives a larger number of data-points for analysis.

Various embodiments can be digitally synthesized (e.g., using Register Transfer Logic language (RTL)). In some embodiments, apparatus 100 comprises a clock switch circuitry 101 (also referred to as DTM_CLOCK_SWTCH circuitry), one or more instances of pulse select circuitries 103-106 (also referred to as DTM_PULSE_SELECT circuitry), combinational logic circuitries 107-110 (also referred to as COMBO circuitry which may be optional), and CGU CLOCK gate final circuitries 112-115 coupled together as shown.

In some embodiments, DTM_CLOCK_SWITCH circuitry 101 switches between a scan clock and a functional source clock while entering and exiting capture phase of test pattern generation. Scan clock is a clock used for scanning data or states of sequential logic during a scan or test phase, and functional clock is the clock used for normal or functional operation of the circuit. Scan clock may be of same or different frequency than the functional clock, in accordance with some embodiments. In some embodiments, the functional clock and scan clock are inputs to the DTM_CLOCK_SWITCH circuitry 101. In some embodiments, the output of DTM_CLOCK_SWITCH circuitry 101 is i) a clock which has been switched to an appropriate clock using control signals that indicate at-speed shift and at-speed capture, and ii) a shift control signal that is synchronized to the functional clock.

So as not to obscure the embodiments, blocks with same function are not described separately. It is pointed out that those elements of a figure having the same reference numbers (or names) as the elements of any other figure can operate or function in any manner similar to that described, but are not limited to such.

The switched clock and the synchronized shift control signal from DTM_CLOCK_SWITCH circuitry 101 are inputs to the DTM_PULSE_SELECT circuitries (e.g., 103-106). In some embodiments, DTM_PULSE_SELECT circuitries (e.g., 103-106) also receives functional clock enable signals as input from a functional clock control logic (not shown, but comprising mainly of counters, dividers and simple logic gates). In some embodiments, the output of the DTM_PULSE_SELECT circuitry (e.g., 103) is a clock enable (e.g., DIVCLK_EN1) that is appropriately controlled in both functional and at-speed modes.

In some embodiments, DTM_PULSE_SELECT circuitry (e.g., one of 103, 104, 105, or 106) generates two pulses (e.g., one of DIVCLK_EN1, DIVCLK_EN1, DIVCLK_EN2, DIVCLK_EN3, DIVCLK_EN4) on an output of the clock gate of the derived clocks (e.g. 112, 113, 114 and 115) based on a desired or required divide ratio during a capture procedure. In some embodiments, when not in scan mode, enable signal (e.g., Func EN1, Func EN2, . . . etc.) is used as the functional enable for derived clock DIV1_gen_clk.

In some embodiments, the COMBO circuitry (e.g., one of 107, 108, 109, or 110) is coupled to the DTM_PULSE_SE- LECT (e.g., one of 103, 104, 105, or 106) and changes the functional enable rate for different modes (referred to as MODE). For example, COMBO circuitry 107 changes its output, which is an enable rate, according to 2G, 3G, 4G, 5G communication modes. In some embodiments, COMBO circuitry (e.g., one of 107, 108, 109, or 110) may comprise a divider and/or multiplexer. In some embodiments, the inputs to the COMBO circuitry (e.g., 107) are functional enables (e.g., DIVCLK_EN1, DIVCLK_EN2, DIVCLK_EN3, and DIVCLK_EN4)) from various possible DTM_PULSE_SELECT circuitries (e.g., 103, 104, 105, and 106) and the mode input controls (e.g., MODE) which of the different clock enables is chosen to generate an output clock enable (e.g., output of COMBO circuitry 107) which supports the clock divide ratio based on the selected mode. The output is the selected clock enable, in accordance with some embodiments.

In some embodiments, CGU CLOCK gate final circuitry (e.g., one of 112, 113, 114, or 115) uses an enable (e.g., output of COMBO 107, 108, 109, or 110, respectively) to gate the Source clock so that the output clocks are aligned. It may comprise a simple AND gate or its equivalent. Here, the output clocks are, for example, DIV1_gen_clk, DIV2_gen_clk, DIV3_gen_clk, and DIV4_gen_clk. In some embodiments, the inputs to the CGU Clock Gate circuitry (e.g., 112) are the selected clock enable from the COMBO circuitry (e.g., 107) and the Source clock.

In some embodiments, all desired divide logic and enable logic for clocks are contained inside an at-speed controller and the enable signals generated are the final enables to the output CGU clock gate circuitry (e.g., 112) for the at-speed mode. In some embodiments, the divide logic can still be handled by counters (not shown) which can be programmed at the beginning of the capture cycle. In some embodiments, the clock which programs these registers are made available during at-speed scan.

Figure 2:
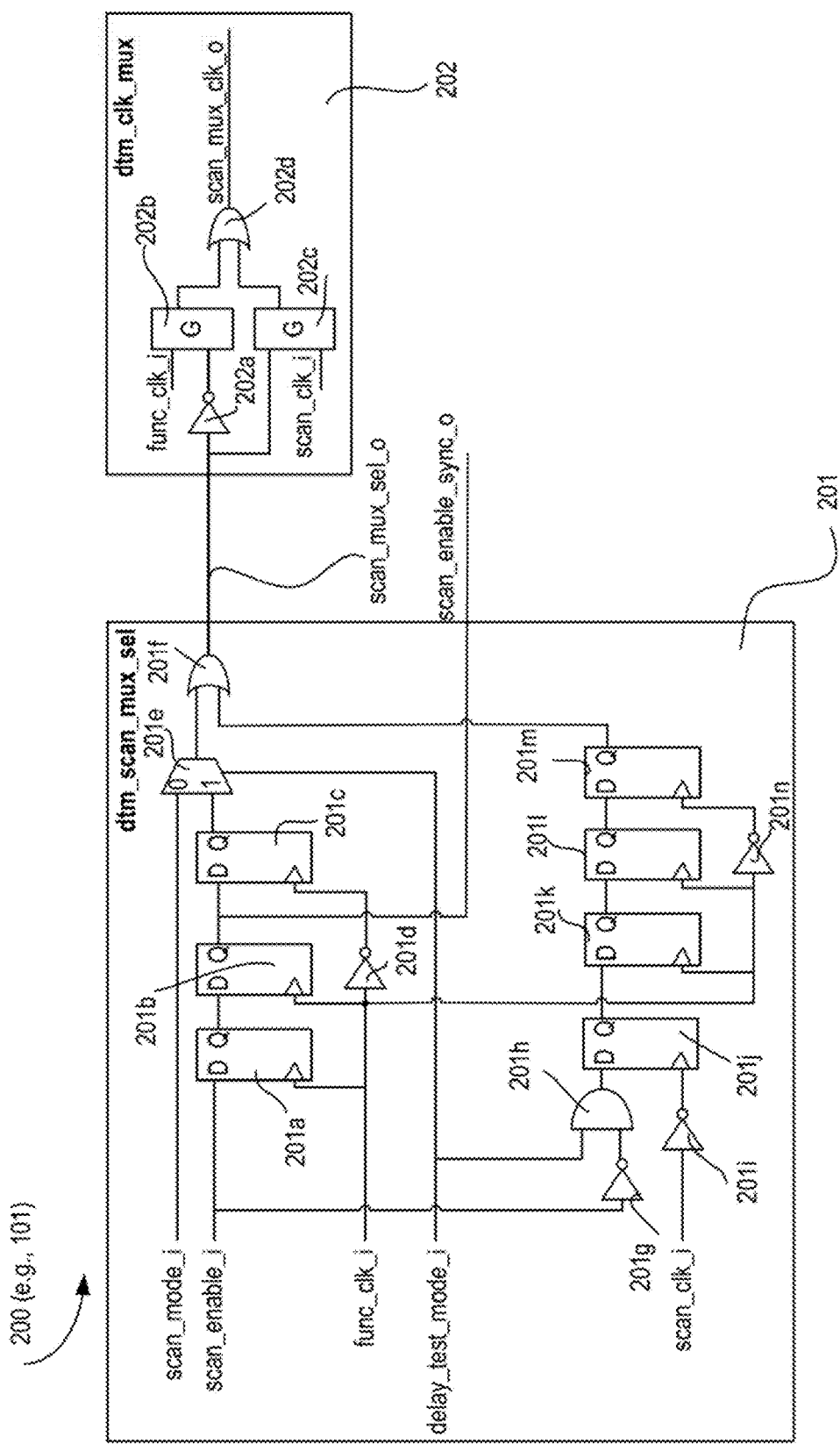
FIG. 2 illustrates a clock switch circuitry as used in FIG. 1, in accordance with some embodiments of the disclosure.

FIG. 2 illustrates a clock switch circuitry 200 (e.g., DTM_CLOCK_SWITCH 101) as used in FIG. 1, in accordance with some embodiments of the disclosure. In some embodiments, clock switch circuitry 200 comprises a multiplexer select circuitry 201 (e.g., dtm_scan_mux_sel) and multiplexer 202 (e.g., dtm_clk_mux). The two outputs of clock switch circuitry 200 discussed here are scan_mux_clk_o (e.g., Source clock) and scan_enable_sync_o (enable synchronization signal). In some embodiments, multiplexer select circuitry 201 comprises shift registers 201a, 201b, and 201c. In some embodiments, shift registers 201a, 201b, and 201c are flip-flops, where data inputs to registers 201a and 201b are clocked or sampled by functional clock (e.g., func_clk_i) and data input of register 201c is clocked or sampled by an inverse of the functional clock, and where the inverse of the functional clock is provided by inverter 201d. The output of register 201b is the scan_enable_sync_o. While multiplexer select circuitry 201 is illustrated by a shifter register chain of two registers 201a and 201b, fewer or more registers may be used, in accordance with some embodiments.

In some embodiments, multiplexer select circuitry 201 comprises a multiplexer 201e which selects one of a scan mode signal (scan_mode_i) or delayed scan enable (e.g., shifted scan_enable_i) according to the logic level of a test mode signal (delay_test_mode_i). In some embodiments, multiplexer select circuitry 201 comprises inverters 201g and 201i, AND logic gate 201h and register 201j to sample an AND-ed version of an inverse of scan enable signal (scan_enable_i) and test mode signal (delay_test_mode_i) using an inverse of scan clock (scan_clk_i). In some embodiments, multiplexer select circuitry 201 comprises another shift register including registers 201k, 201l, and 201m, where data inputs to registers 201k and 201l are clocked or sampled by a functional clock (e.g., func_clk_i) and data input of register 201m is clocked or sampled by an inverse of the functional clock, and where the inverse of the functional clock is provided by inverter 201n. In some embodiments, multiplexer select circuitry 201 comprises an OR gate 201f which performs an OR function on the outputs of multiplexer 201e and register 201m to provide a multiplexer select signal (e.g., scan_mux_sel_o).

In some embodiments, clock multiplexer 202 (also referred to as dtm_clk_mux) comprises inverter 202a, gating elements (G) 202b and 202c, and OR gate 202d. In some embodiments, gating elements 202b and 202c are implemented as AND gate. Functionally, clock multiplexer 202 is a 2:1 multiplexer where scan_mux_sel_o is the select signal, func_clk_i and scan_clk_i are the two input signals, and scan_mux_clk_o is the output signal.

The DTM_CLOCK_SWITCH circuitry 200/101 switches between the functional clock and scan clock based on the state of the circuit with respect to at-speed mode, in accordance with some embodiments. The switching is glitchless for all transitions, in accordance with some embodiments. In some embodiments, DTM_CLOCK_SWITCH circuitry 200/101 handles switching i) from functional clock to scan clock when entering the shift-in stage, ii) from scan clock to functional clock when entering capture mode and iii) from functional clock to scan clock during capture mode after the capture cycles are done. In some embodiments, a synchronized version of scan enable (e.g., scan_enable_sync_o) is generated and used within the DTM_CLOCK_SWITCH circuitry 200 and passed on to the DTM_PULSE_SELECT circuitry (e.g., 103-106). The final multiplexing between the functional clock and scan clock is implemented with clock gating elements and an OR gate (or its equivalent) to avoid clock glitches. This also makes it easier for the backend tools to handle timing since the timing endpoint (e.g., the clock gate) is implicit. The DTM_CLOCK_SWITCH circuitry 200 handles stuck-at scan also by bypassing the at-speed switching logic when not in at-speed mode. In some embodiments, the apparatus can switch between delay test capture mode and delay test shift phase mode (scan mode). For example, scan clock pulse is used to switch between the modes.

Figure 3:
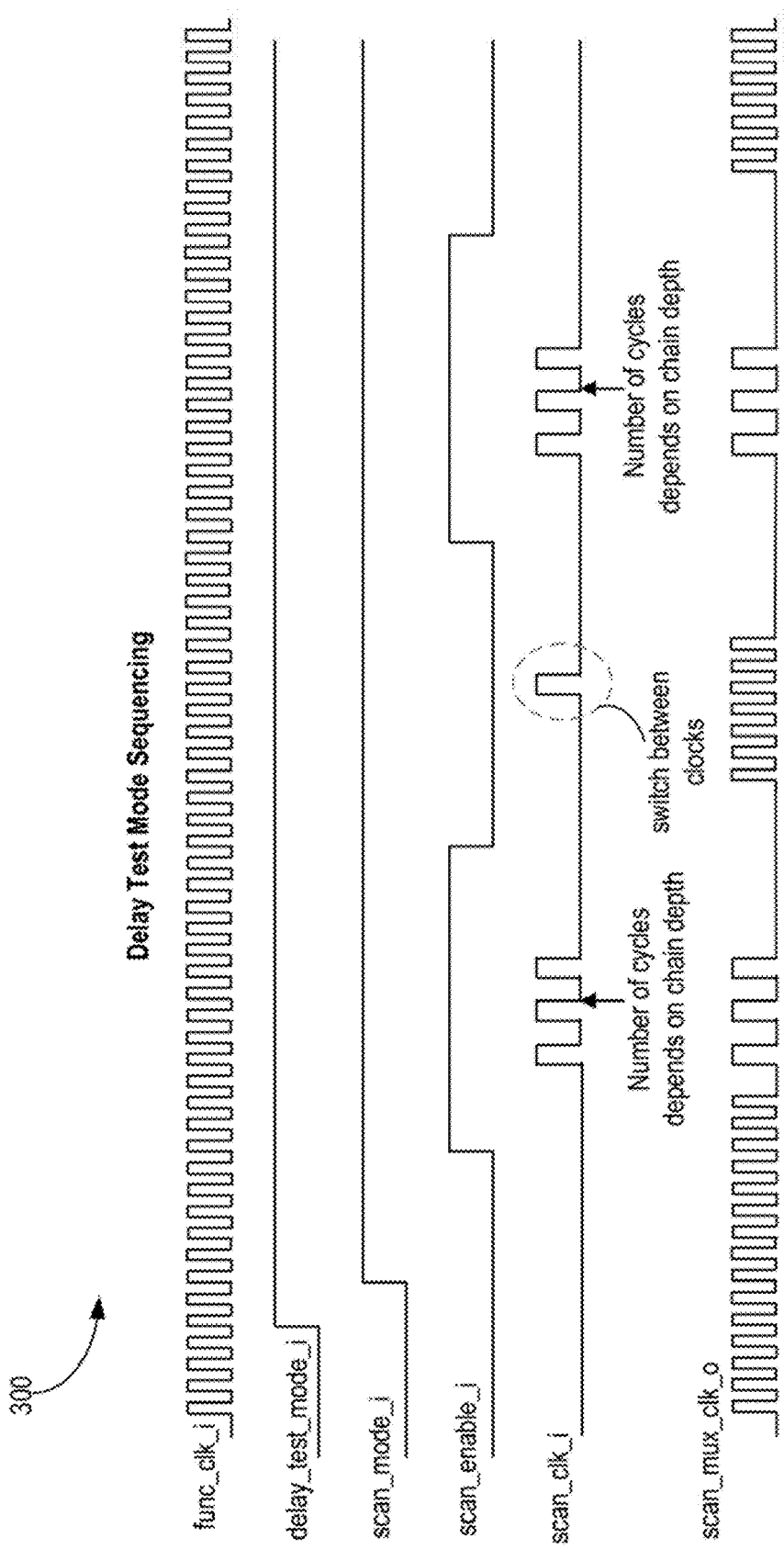
FIG. 3 illustrates a timing diagram of the various signals of the clock switch circuitry of FIG. 2, in accordance with some embodiments of the disclosure.

FIG. 3 illustrates a timing diagram 300 of the various signals of clock switch circuitry 101 (e.g., DTM_CLOCK_SWITCH circuitry) of FIG. 2, in accordance with some embodiments of the disclosure. In some embodiments, delay_test_mode_i is set before scan_mode_i if it is desired to avoid glitches on the output of the scan multiplexer when these signals are being set. However, in some cases, glitches on the output may not cause any issue because the effect of the glitch on the functional domain is corrected when the test pattern is shifted in, in accordance with some embodiments. In some embodiments, it is assumed that delay_test_mode_i and scan_enable_i are static signals with respect to scan_clk_i since the timing can be controlled from a tester.

Timing diagram 300 also illustrates the operation of the DTM_CLOCK_SWITCH circuitry 200. In some embodiments, the functional clock (func_clk_i) is assumed to be running before entering the at-speed mode. In some embodiments, at-speed mode is entered when both delay_test_mode_i and scan_mode_i are asserted, in accordance with some embodiments. At this time, the functional clock is sent to the output. When scan_enable_i is asserted, the DTM_CLOCK_SWITCH circuitry 200 switches the output from the functional clock to the scan clock. At this time, the scan clock is not running ensuring glitchless switching, in accordance with some embodiments.

In some embodiments, the scan clock is used to shift in the test pattern. On de-assertion of scan_enable_i (e.g., going from shift mode to capture mode), the output is switched from the scan clock to the functional clock. At this time, the registers in the DTM_PULSE_SELECT circuitry (e.g., 103) are loaded. Therefore, though the output clock (Source clock) of the DTM_CLOCK_SWITCH circuitry 100/101 will be running, the DTM_PULSE_SELECT circuitry (e.g., 103) will control the number and location of the enable pulses (e.g., DIVCLK_EN1) generated based on the pattern loaded into its registers, in accordance with some embodiments. After the capture operation is completed, the DTM_CLOCK_SWITCH circuitry 200/101 switches back the output clock (Source clock) from the functional source clock to the scan clock when a scan clock edge is provided, in accordance with some embodiments.

Figure 4:
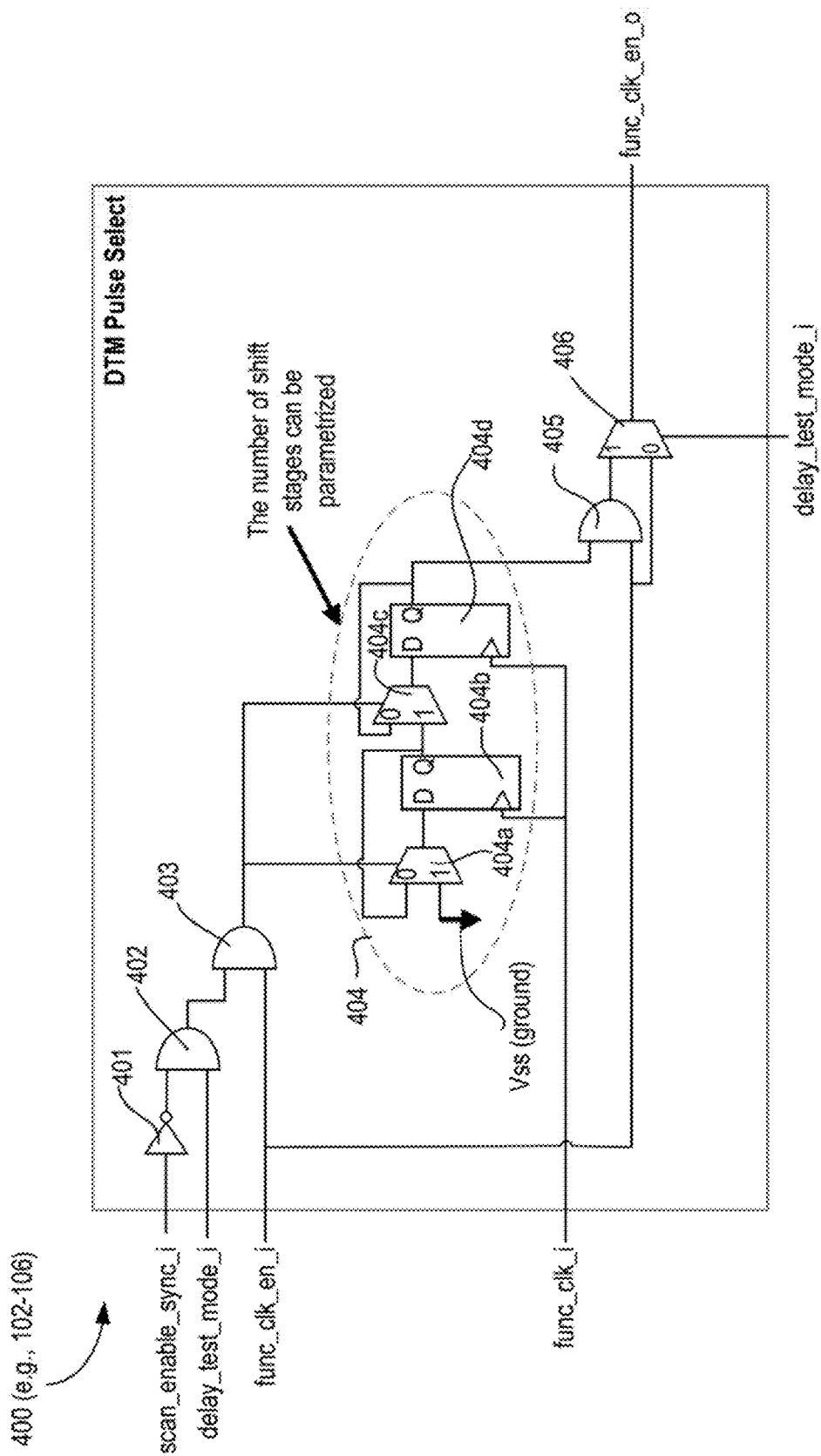
FIG. 4 illustrates a pulse select circuitry of FIG. 1, in accordance with some embodiments of the disclosure.

FIG. 4 illustrates a DTM_PULSE_SELECT circuitry 400 (e.g., one of 103-106) of FIG. 1, in accordance with some embodiments of the disclosure. In some embodiments, DTM_PULSE_SELECT circuitry 400 comprises combinational logic such as inverter 401, AND gates 402, 403, and 405, and multiplexer 406, and shift register 404 coupled together as shown. In some embodiments, shift register 404 comprises stages of multiplexer and flip-flops in a feedback configuration. For example, shift register 404 comprises a first stage including 2:1 multiplexer 404a and flip-flop 404b, where multiplexer 404a selectively provides one of an output of flip-flop 404b or constant value (e.g., Vss) as input to flip-flop 404b, and where flip-flop 404b receives func_clk_i as sampling clock. In some embodiments, shift register 404 comprises a second stage including 2:1 multiplexer 404c and flip-flop 404d, where multiplexer 404c selectively provides one of an output of flip-flop 404c or the output of first stage as input to flip-flop 404d, and where flip-flop 404d receives func_clk_i as sampling clock.

In some embodiments, any number of stages can be concatenated in shift register 404. By adding more stages, a wide range of pulses can be generated. For example, with 8 stages, 8 pulses can be generated. In some embodiments, when a counter based implementation is used with a decoder instead of using a shift register chain, more number of pulses can be generated. In one such example, the counter is a state machine and the output of some or all states can be pulses. With more pulses, flexibility is enhanced because different pulses can be selected. For example, pulse 3 and 4 is selected from 8 generated pulses. In some embodiments, the output of shift register 404 is AND-ed with func_clk_en_i by AND gate 405. The output of AND gate 405 is then used as input to 2:1 multiplexer 406 which selectively provides that output or the func_clk_en_i as func_clk_en_o according to the test mode signal delay_test_mode_i.

In some embodiments, the functional clock enable input signal (func_clk_en_i which is one of Func EN1, Func EN2, Func EN3, or Func EN4) is generated off the functional clock generation logic (e.g., counters and clock divide logic). In some embodiments, the DTM_PULSE_SELECT circuitry 400 can be instantiated (e.g., added or inserted) just before the generated clock gates in order to generate a fixed number of divided clock pulses (of the source clock) for the at-speed scan capture phase.

Another feature of DTM_PULSE_SELECT circuitry 400, which helps in increasing the test coverage numbers, is that the number of functional clock pulses to be generated for the capture procedure of at-speed scan testing is parameterized (e.g., completely parameterized), in accordance with some embodiments. In some embodiments, the location of the pulses is entirely selectable as well based on the values shifted in (e.g., via a shift cycle) to a clock control logic and pulse select flops. This allows the added flexibility to test data transfer between derived clocks running or operating at different frequencies, mainly referred to as up-sampling (e.g., when launch frequency is less than capture frequency) and down-sampling (e.g., when launch frequency is greater than capture frequency). In some embodiments, a counter and decode logic can be used to select 'N' number and location of pulses based on desired usage.

In some embodiments, DTM_PULSE_SELECT circuitry 400 uses functional enable signals (e.g., func_clk_en_i) from counters to generate these pulses for at-speed scan capture phase thus implicitly testing any faults in the clock control logic. In some embodiments, by separating the DTM_CLOCK_SWITCH 200/101 and the DTM_PULSE_SELECT circuitries (e.g., 103-106), varied divide ratios of generated clocks can be covered, thus helping increase delay test coverage.

In some embodiments, asynchronous domains can be handled efficiently by turning on the clocks of the clock domain being tested and turning off the clocks to all the asynchronous domains to the current clock domain under test. This can be done by shifting in appropriate values to the pulse select registers to turn on/off clocks, in accordance with some embodiments.

Figure 5:
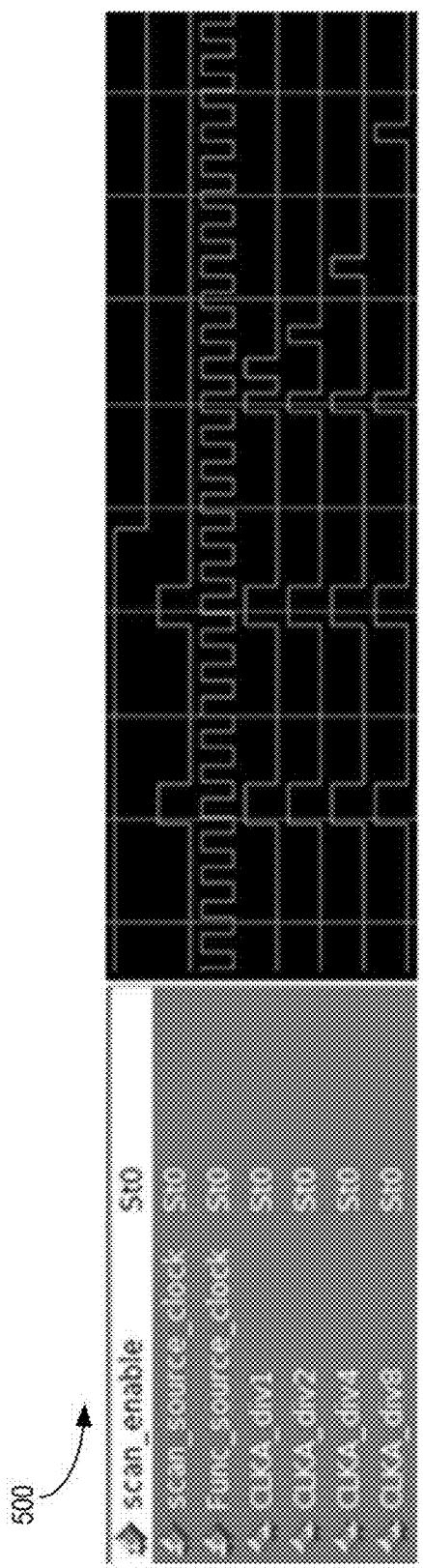
FIG. 5 illustrates a plot showing the clock waveforms at the Final Clock gate circuitries of FIG. 1, in accordance with some embodiments of the disclosure.
Figure 6:
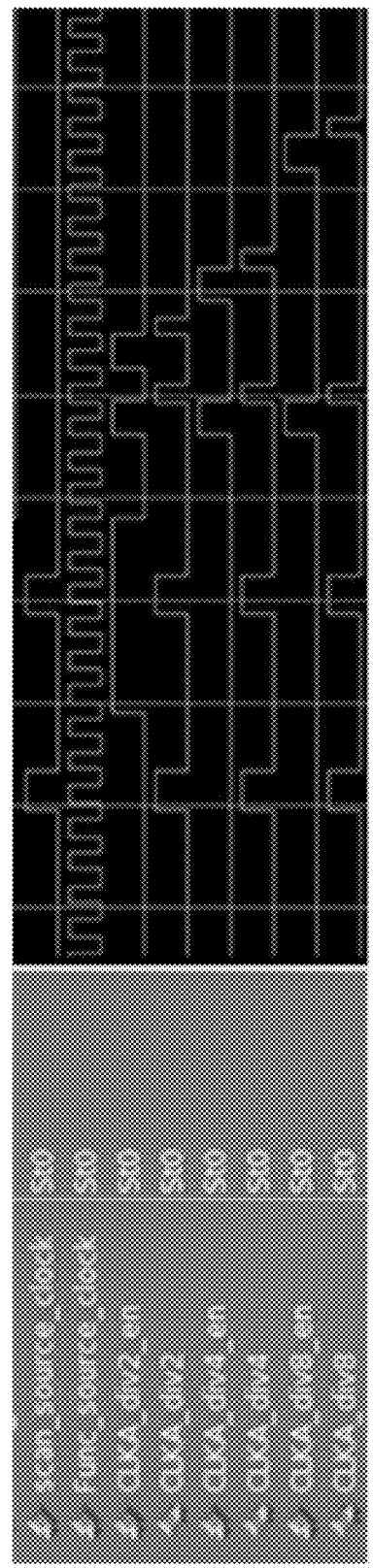
FIG. 6 illustrates a plot showing usage of functional enables of FIG. 1 to generate the divided clocks shown in FIG. 5, in accordance with some embodiments.

FIG. 5 illustrates plot 500 showing the clock waveforms at the Final Clock gate circuitries (e.g., 112-115) of FIG. 1, in accordance with some embodiments of the disclosure. FIG. 6 illustrates plot 600 showing usage of the functional enables described in FIG. 1 to generate the divided clocks shown in FIG. 5.

Here, x-axis is time and y-axis is logic level '0' or '1', scan_enable is same as scan_enable_i, scan_source_clock is same as scan clock, Func_source_clock is same as Functional Source Clock, CLKA_div1 is same as DIV1_gen_clk, CLKA_div2 is same as DIV2_gen_clk, CLKA_div4 is same as DIV3_gen_clk, CLKA_div8 is same as DIV4_gen_clk, CLKA_div2_en is same as DIVCLK_EN2, CLKA_div4_en is same as DIVCLK_EN3, and CLKA_div8_en is same as DIVCLK_EN4.

A sample of both the DTM clock switch 101 and the DTM pulse select logic (e.g., one of 103-106) is observed in these waveforms. When the scan_enable signal is active (e.g., logic '1'), the output derived clocks are a function of the scan source clock (e.g., at-speed scan shift phase). When the scan enable signal is inactive (e.g., logic '0'), the derived clocks are a function of the functional source clock with their corresponding divide ratios as defined by the design intent (e.g., at-speed scan capture phase).

In some embodiments, data transfer is supported between any of these derived clocks whether they are of the same frequency or different frequency (e.g., up-sampling or down-sampling) since functional clock generation logic may be used to generate the clock enables shown in FIG. 5. In some embodiments, edges of all these clocks are aligned during at-speed scan capture phase and coverage on any in-frequency or out-frequency data—path based on the design intent—is achieved.

For instance, for a launch flip-flop clocked by CLKA_div1 and a capture flop clocked by the same clock, this launch capture pair can be added as discussed in the tool guidelines (e.g., in-frequency data transfer). Also, for a data-path where the launch flop is clocked by CLKA_div8 and the capture flop is clocked by CLKA_div2, this launch capture pair can be added as discussed in the tool guidelines (e.g., out-frequency data transfer→up-sampling). Similarly, for a data-path wherein the launch flop is clocked by CLKA_div2 and the capture flop is clocked by CLKA_div4, this launch capture pair can be added as discussed in the tool guidelines (out-frequency data transfer→down-sampling).

The following section describes various tool guidelines for using the at-speed scan testing. While some embodiments use test pattern generation using Mentor Graphics Tessent Testcompress®, other comparable tools can also be used. Launch capture pairs may need to be declared based on the clock domain being tested.

There are two cases which provide references to the FIG. 5 description here: First, in frequency data transfer (e.g., data transfer from 200 MHz to 200 MHz).

Command: set launch_capture_pair clkA_div1_200 MHz clkA_div1_200 MHz.

Second Out frequency data transfer, for Up-sampling (e.g., data transfer from 25 MHz to 100 MHz).

Command: set launch_capture_pair clkA_div8_25 MHz clkA_div2_100 MHz; for Down-sampling (e.g., data transfer from 100 MHz to 50 MHz):

Command: Set launch_capture_pair clkA_div2_100 MHz clkA_div4_50 MHz.

Capture procedures may be declared based on the clock domain being tested. The capture procedure described below is used by an at-speed scan pattern generation tool to emulate the behavior of the generated clocks at the output of the CGU, depicted in FIG. 5. The comments are added inline to better explain these TCL commands (modeled for Test Pattern Generation (TPG) using Mentor Graphics® TPG generation tool):

```
mode internal =
   timeplate ws_sc_capt ;
   cycle =
      force_pi;
      force scan_en 0;
      force edt_clk 0;
      force scan_reset_trx 1;
      force scan_reset_main 1;
      force clk_internal 0;
         pulse func_source_clk;
         pulse clkA_div1; // 1st intern clock pulse
         pulse clkA_div2;
         pulse clkA_div4;
         pulse clkA_div8;
      end;
   cycle =
         pulse func_source_clk;
         pulse clkA_div1; // 2nd intern clock pulse
         force clkA_div2 0;
         force clkA_div4 0;
         force clkA_div8 0;
      end;
   cycle = //3 cycle
         pulse func_source_clk;
         force clkA_div1 0; // 3rd intern clock pulse
         pulse clkA_div2;
         force clkA_div4 0;
         force clkA_div8 0;
      end;
   cycle = //4 cycle
         pulse func_source_clk;
         force clkA_div1 0;
         force clkA_div2 0;
         force clkA_div4 0;
         force clkA_div8 0;
      end;
   cycle = //5 cycle
         pulse func_source_clk;
         force clkA_div1 0;
         force clkA_div2 0;
```

-continued

```
         pulse clkA_div4 ;
         force clkA_div8 0;
      end;
```

The clock groups being pulsed here are a collection of clocks at the output of the final clock gates shown in FIG. 1 grouped based on their frequencies. In this example, a total of 9 such cycles (e.g., only 5 shown here) are shown to realize a maximum divide ratio of 8. The clocks may need to be pulsed in the capture procedure depends on the divide ratio emulating the design intent (an example for which is shown in FIG. 5).

The following section describes setting of various variables for testing asynchronous clock domains. Suppose there are two asynchronous clocks clka and clkb and the logic to be tested is clocked by clkb, then:

Turn off clkb by shifting in appropriate values to the DTM_PULSE_SEL registers.
   condition/top/inst1/i_dtm_pulse_select_clka/dtm_pulse_sel_reg[0] 0
   condition/top/inst1/i_dtm_pulse_select_clka/dtm_pulse_sel_reg[1] 0

Turn on clkb by shifting in appropriate values to the DTM_PULSE_SEL registers.
   condition/top/inst1/i_dtm_pulse_select_clkb/dtm_pulse_sel_reg[0] 1
   condition/top/inst1/i_dtm_pulse_select_clkb/dtm_pulse_sel_reg[1] 1

In this example, writing a three (2'b11) in the DTM pulse select registers (2 bit wide) (e.g., 404b and 404d) results in two clock pulses for the scan at-speed capture phase. The number of these pulse select registers and thereby the number and positioning of the capture pulses may be completely parameterized, in accordance with some embodiments.

Both clk1 and clk2 are asynchronous clocks and can be tested together if we have a loopback logic shown below at the crossing points to handle clock domain crossing (CDC). This results in coverage improvement on the boundary flops and also allows generating a single pattern to test multiple clock domains.

Figure 7:
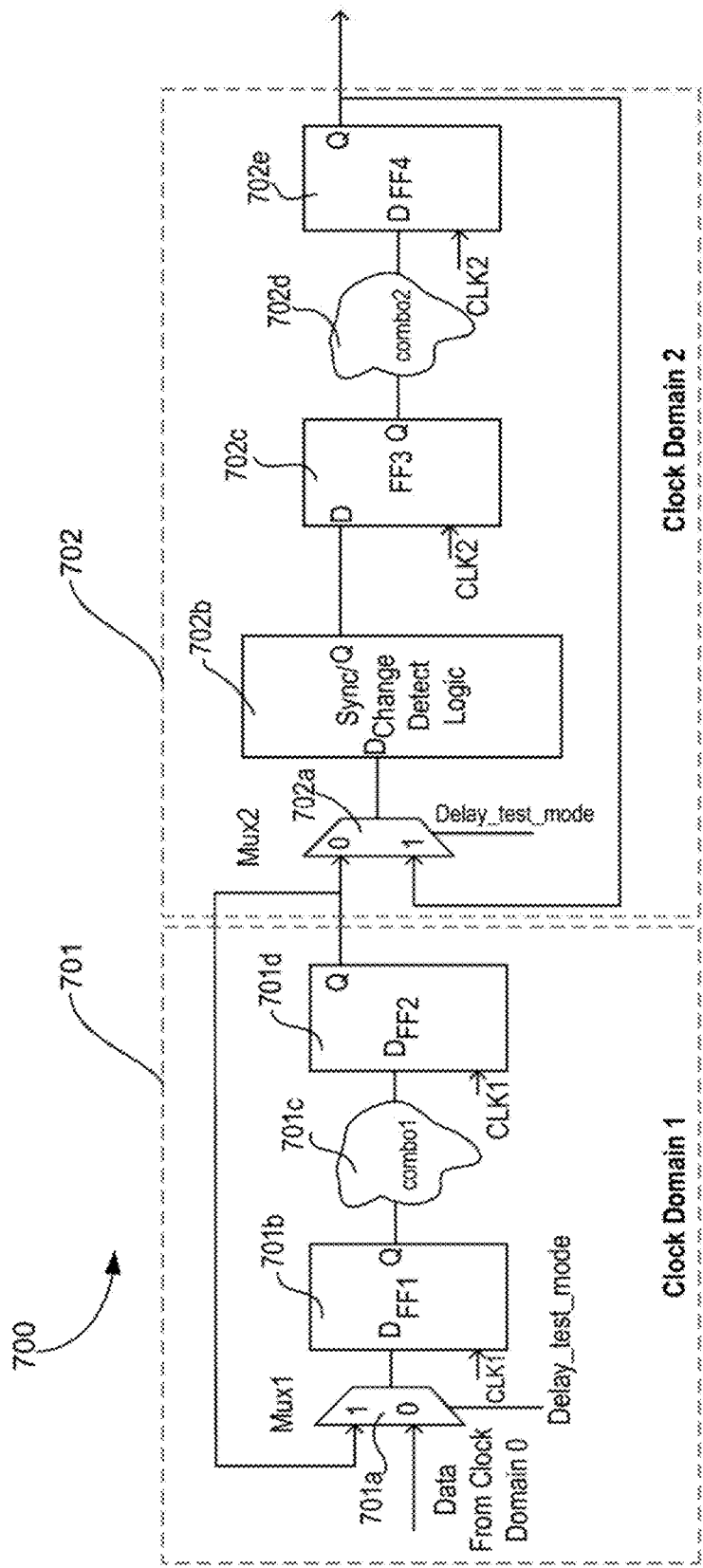
FIG. 7 illustrates an apparatus showing handling of clock domain crossing to improve coverage and reduce pattern depth thereby saving tester time, according to some embodiments of the disclosure.

FIG. 7 illustrates apparatus 700 showing handling of clock domain crossing to improve coverage and reduce pattern depth thereby saving tester time, according to some embodiments of the disclosure. Here, two clock domains are shown 701 and 702. In this example, clock domain 701 includes 2:1 multiplexer 701a (Mux1), first flip-flop (FF1) 701b, combination logic (combo1) 701c, and second flip-flop (FF2) 701d coupled together as shown. In this example, clock domain 702 includes 2:1 multiplexer 701b (Mux2), synchronous change detect logic 702b, third flip-flop (FF3) 701c, combination logic (combo2) 702d, and fourth flip-flop (FF4) 702e coupled together as shown.

In some embodiments, Mux2 isolates clock domain 2 from clock domain 1 in at-speed mode (using the delay_test_mode signal) by looping clock domain 2 data back to the sync/change detect logic 702b. In some embodiments, condition statements in RTL may be declared to control (e.g., by shifting in data) the functional clock control counters and clock enable registers to generate clocks for at-speed scan properly. In some embodiments, flops (e.g., clock control flops) are added into a sideband chain to shift in/out control data to these flops without facing the overhead of an EDT (Embedded Deterministic Test) controller.

In some embodiments, at-speed scan coverage increases by instantiating the DTM shift and DTM capture blocks separately which gives the flexibility to instantiate the pulse select block on any derived clock. The pulse select block uses functional clock generation logic to generate divided clocks at the right frequency and can also select the number of capture pulses in the capture procedure for any derived clock and the positioning of these capture pulses thus adding to design and test flexibility and in-turn adding to the coverage numbers.

In some embodiments, functional clock generation logic is used to generate capture pulses thus implicitly testing the functional clock generation logic.

Various embodiments discussed here illustrate how to instantiate the DTM_CLOCK_SWITCH circuitry 101 at the source clock origin and then instantiate multiple DTM_PULSE_SELECT circuitries (e.g., 103-106) hence giving the flexibility to "plug and play" in order to handle divided clocks over varied ranges efficiently. The DTM_PULSE_SELECT circuitries (e.g., 103-106) uses signals from functional counters and other clock control logic. This gives a tremendous coverage improvement since some embodiments can test all frequency ranges in a particular domain including up-sampling/down-sampling data paths where the clock frequency of the source and destination domain is not the same. The functional clock control logic is implicitly added to the coverage numbers as described above.

Figure 8:
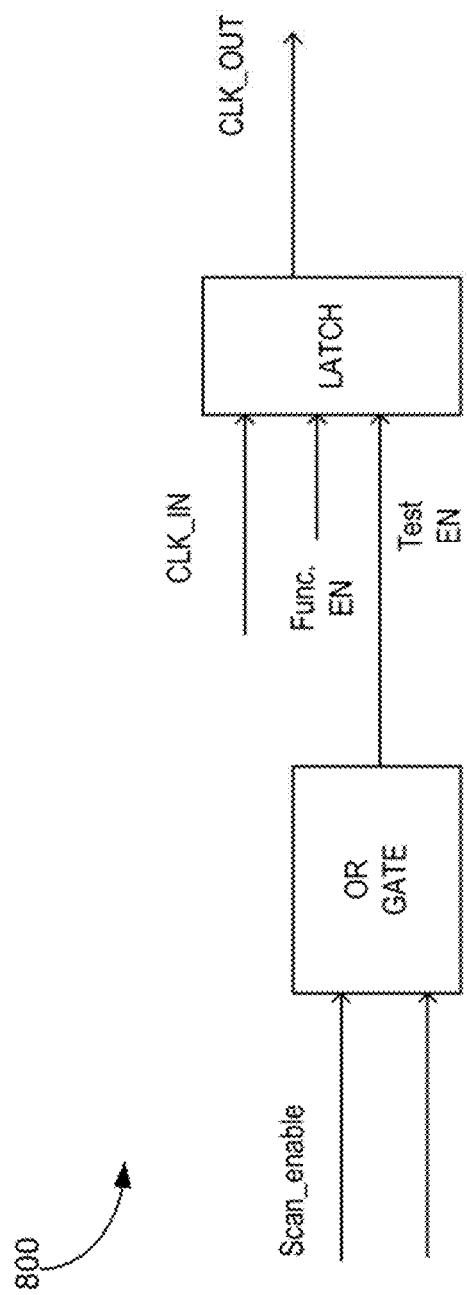
FIG. 8 illustrates a latch which is inserted by a synthesis tool to save power, in accordance with some embodiments.

FIG. 8 illustrates a latch apparatus 800 which is inserted by a synthesis tool to save power, in accordance with some embodiments. In some embodiments, latches of FIG. 8 are inserted by the synthesis tool automatically to save dynamic power based on RTL intent. These latches may be added upstream to a register or a flip-flop, in accordance with some embodiments. The enable signal to these latches may come from an input pin (e.g., mostly treated as X (e.g., don't care)) or from an asynchronous clock domain (e.g., X again) which results in X propagation via the clock to all downstream flops. These latches may need to be left "open" in at-speed mode as described in FIG. 1. This circuit described in FIG. 8 can be applied selectively to clock gating latches, in accordance with some embodiments.

Control registers hold their values during the capture procedure phase. In some embodiments, write enable and write request registers are set to '0' for pattern generation. Some data-paths highly sensitive to the programming of control registers (separate clock domain). The control/data signals coming out of the control register clock domain might be static or dynamic (clock domain crossover handled by synchronizers/change detect logic). These registers may not change their values amidst a capture procedure, in accordance with some embodiments. The functional clock generation logic is used to generate capture pulses thus implicitly testing the functional clock generation logic, in accordance with some embodiments.

Figure 9:
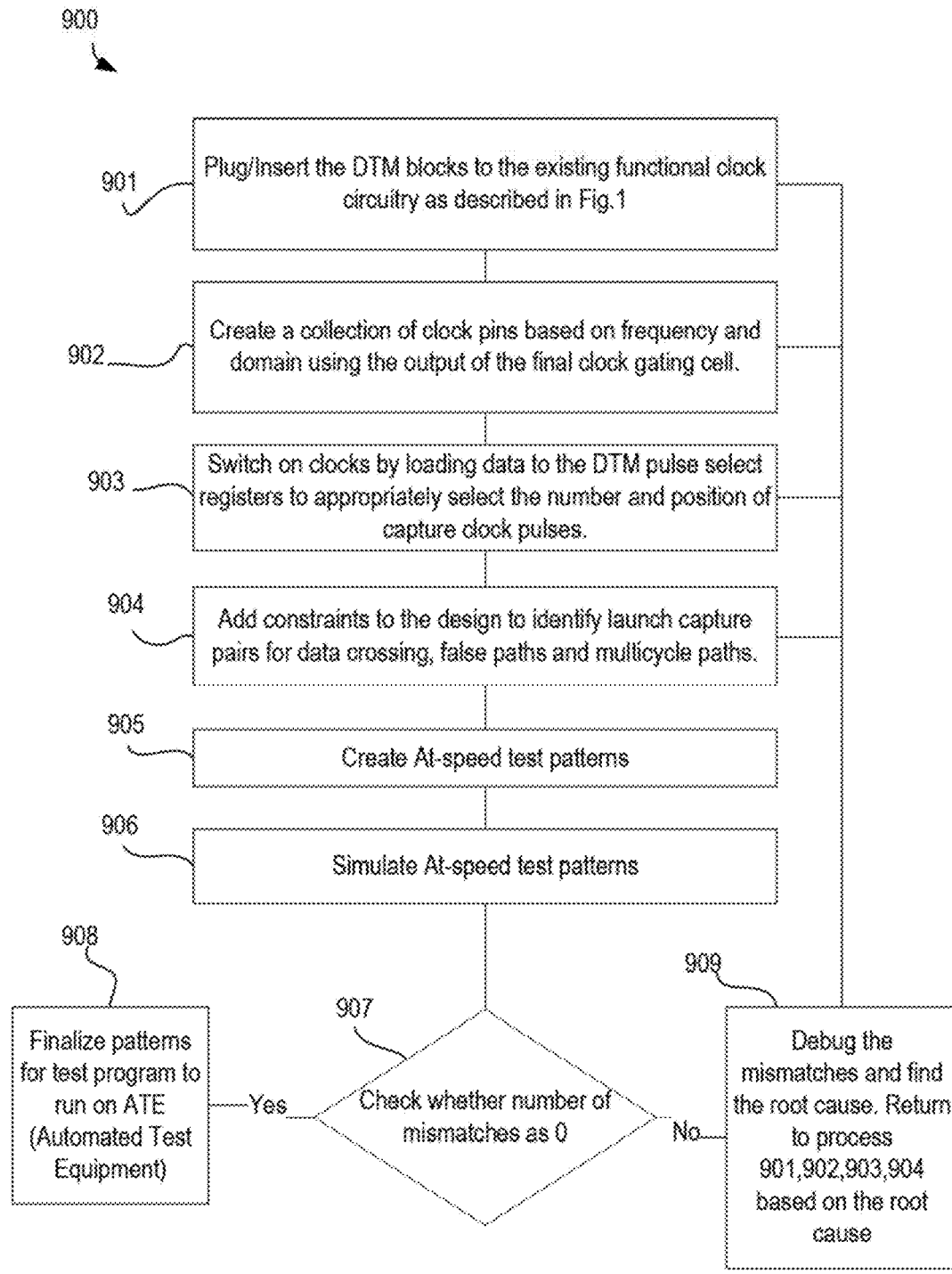
FIG. 9 illustrates a flowchart of a method of generating test patterns, in accordance with some embodiments.

FIG. 9 illustrates a flowchart 900 of a method of generating test patterns, in accordance with some embodiments. While the blocks or operations are shown in a specific order, the order is not limiting. For example, some blocks or operations can be performed or executed together/simultaneously while others blocks or operations can be executed before the other.

At block 901, DTM blocks are inserted into existing functional clock circuitry as described with reference to FIG. 1. At block 902, a collection of clock pins is created based on frequency and domain. In various embodiments, the clock pins are created using the output of the final clock gating cell. At block 903, clocks are turned on (e.g., clock circuits are undated) and data is loading to the DTM pulse select registers to appropriately select the number and position of capture clock pulses. At block 904, constraints are added to the design to identify launch capture pairs for data crossings, false paths and multicycle paths. At block 905, at-speed test patterns are created. At block 906, at-speed test patterns are simulated. At block 907, a determination is made whether the number of mismatches is zero. If the number of mismatches is zero, then the process proceeds to block 908. At block 908, the patterns are finalized for the test program to run on automated test equipment (ATE). If the number of mismatches is not zero, then the process proceeds to block 909. At block 909, the mismatches are debugs and the root cause of the mismatch is determined. The process then proceeds to any one of blocks 901, 902, 903, or 904 according to the determined root cause.

Figure 10:
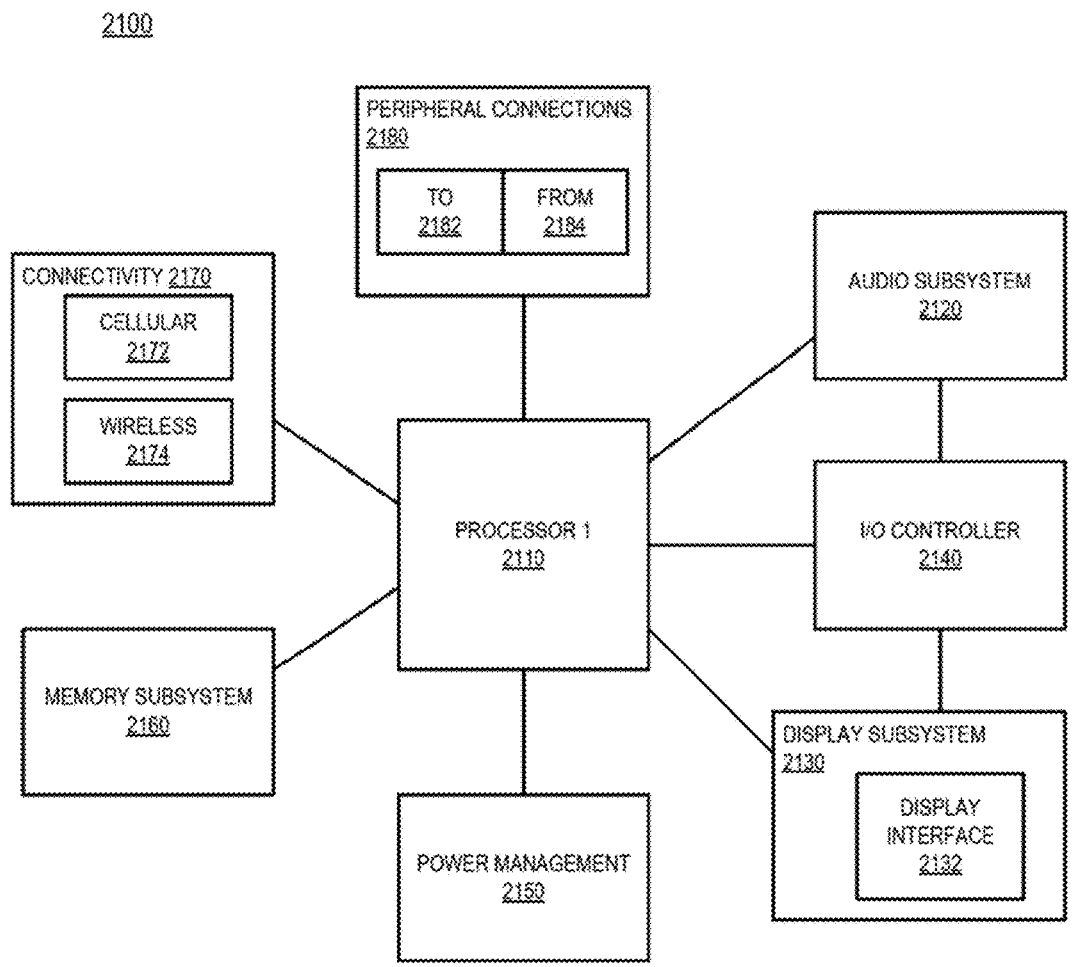
FIG. 10 illustrates a smart device or a computer system or a SoC (System-on-Chip) having an apparatus for at-speed scan testing of one or more circuits, in accordance with some embodiments.

FIG. 10 illustrates a smart device or a computer system or a SoC (System-on-Chip) 2100 with apparatus for at-speed scan, according to some embodiments. For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in in computing device 2100. Any of the blocks in the SoC can have apparatus for at-speed scan of the various embodiments.

In some embodiments, computing device 2100 includes first processor 2110 and network interface within 2170 such as a wireless interface so that a system embodiment may be incorporated into a wireless device, for example, cell phone or personal digital assistant.

In some embodiments, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O. The at-speed scan apparatus of some embodiments can be included in any or all of the blocks of FIG. 9 for testing the logic of those blocks.

In some embodiments, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

In some embodiments, computing device 2100 comprises display subsystem 2130. Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

In some embodiments, computing device 2100 comprises I/O controller 2140. I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In some embodiments, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In some embodiments, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In some embodiments, Memory subsystem 2160 includes the scheme of analog in-memory pattern matching with the use of resistive memory elements.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 2100 comprises connectivity 2170. Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 2100 comprises peripheral connections 2180. Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a circuitry to selectively switch between a functional clock or a scan clock; a first plurality of circuitries to generate a plurality of pulses according to the scan or functional clocks; and a second plurality of circuitries to generate a plurality of clocks according to the plurality of pulses, wherein the plurality of clocks are for testing one or more circuitries.

Example 2

The apparatus of example 1, wherein the circuitry comprises a second circuitry to generate a multiplexer select signal.

Example 3

The apparatus of example 2, wherein the circuitry comprises a multiplexer to provide one of the functional clock or the scan clock according to a logic state of the multiplexer select signal.

Example 4

The apparatus of example 3, wherein the second circuitry comprises: a first shift register chain; a second shift register chain; and a logic gate to generate the multiplexer select signal according to outputs of the first and second shift register chains.

Example 5

The apparatus according to any of preceding apparatus examples, wherein one of the circuitries of the first plurality of circuitries comprises a first combinational logic to generate a select signal.

Example 6

The apparatus of example 5, wherein the one of the circuitries of the first plurality of circuitries comprises a shift register chain including multiplexers controllable by the select signal.

Example 7

The apparatus of example 6, wherein the one of the circuitries of the first plurality of circuitries comprises a second combinational logic to generate a pulse according to the scan or functional clocks.

Example 8

The apparatus according to any of preceding apparatus examples comprises logic to apply a clock from among the plurality of clocks when a first domain is being tested, and to turn off a clock from among the plurality of clocks when a second domain is an asynchronous domain.

Example 9

A system comprising: a memory; a processor coupled to the memory; and a wired and wireless interface to allow the processor to communicate with another device, wherein the processor includes an apparatus for at-speed testing of one or more circuitries, wherein the apparatus includes: a circuitry to selectively switch between a functional clock or a scan clock; a first plurality of circuitries to generate a plurality of pulses according to the scan or functional clocks; and a second plurality of circuitries to generate a plurality of clocks according to the plurality of pulses, wherein the plurality of clocks are for testing the one or more circuitries.

Example 10

The system of example 9, wherein the processor comprises logic to apply a clock from among the plurality of clocks when a first domain is being tested, and to turn off a clock from among the plurality of clocks when a second domain is an asynchronous domain.

Example 11

The system according to any of preceding system examples, wherein the circuitry comprises a second circuitry to generate a multiplexer select signal.

Example 12

The system of example 11, wherein the circuitry comprises a multiplexer to provide one of the functional clock or the scan clock according to a logic state of the multiplexer select signal.

Example 13

The system of example 11, wherein the second circuitry comprises: a first shift register chain; a second shift register chain; and a logic gate to generate the multiplexer select signal according to outputs of the first and second shift register chains.

Example 14

The system of example 9, wherein one of the circuitries of the first plurality of circuitries comprises: a first combinational logic to generate a select signal; a shift register chain including multiplexers controllable by the select signal; and a second combinational logic to generate a pulse according to the scan or functional clocks.

Example 15

A method comprising: selectively switching between a functional clock or a scan clock; generating a plurality of pulses according to the scan or functional clocks; generating a plurality of clocks according to the plurality of pulses; and testing one or more circuitries using the plurality of clocks.

Example 16

The method of example 15 comprises applying a clock from among the plurality of clocks when a first domain is being tested.

Example 17

The method according to any of preceding method examples comprises turning off or gating a clock from among the plurality of clocks when a second domain is an asynchronous domain.

Example 18

The method according to any of preceding method examples comprises: generating a multiplexer select signal; and providing one of the functional clock or the scan clock according to a logic state of the multiplexer select signal.

Example 19

An apparatus comprising: a first circuitry for selectively switching between a functional clock or a scan clock; a second circuitry for generating a plurality of pulses according to the scan or functional clocks; a third circuitry for generating a plurality of clocks according to the plurality of pulses; and a fourth circuitry for testing one or more circuitries using the plurality of clocks.

Example 20

The apparatus of example 19 comprises: a fifth circuitry for generating a multiplexer select signal; and a sixth circuitry for providing one of the functional clock or the scan clock according to the multiplexer select signal.

Example 21

An apparatus comprising: means for selectively switching between a functional clock or a scan clock; means for generating a plurality of pulses according to the scan or functional clocks; means for generating a plurality of clocks according to the plurality of pulses; and means for testing one or more circuitries using the plurality of clocks.

Example 22

The apparatus of example 21 comprises: means for generating a multiplexer select signal; and means for providing one of the functional clock or the scan clock according to the multiplexer select signal.

Example 23

A machine-readable storage media having machine executable instructions that, when executed, cause a machine to perform an operation comprising: selectively switching between a functional clock or a scan clock; generating a plurality of pulses according to the scan or functional clocks; generating a plurality of clocks according to the plurality of pulses; and testing one or more circuitries using the plurality of clocks.

Example 24

The machine-readable storage media of example 23 having further machine executable instructions that, when executed, cause the machine to perform a further operation comprising applying a clock from among the plurality of clocks when a first domain is being tested.

Example 25

The machine-readable storage media of example 24 having further machine executable instructions that, when executed, cause the machine to perform a further operation turning off or gating a clock from among the plurality of clocks when a second domain is an asynchronous domain.

Example 26

The machine-readable storage media of example 25 having further machine executable instructions that, when executed, cause the machine to perform a further operation comprising: generating a multiplexer select signal; and providing one of the functional clock or the scan clock according to a logic state of the multiplexer select signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a circuitry to selectively switch between a functional clock or a scan clock;
a first plurality of circuitries to generate a plurality of pulses according to the scan or functional clocks;
a second plurality of circuitries to generate a plurality of clocks according to the plurality of pulses, wherein the plurality of clocks are for testing one or more circuitries; and
logic to apply a clock from among the plurality of clocks when a first domain is being tested, and to turn off a clock from among the plurality of clocks for a second domain.

2. The apparatus of claim 1, wherein the circuitry comprises a second circuitry to generate a multiplexer select signal.

3. The apparatus of claim 2, wherein the circuitry comprises a multiplexer to provide one of the functional clock or the scan clock according to a logic state of the multiplexer select signal.

4. The apparatus of claim 3, wherein the second circuitry comprises:
a first shift register chain;
a second shift register chain; and
a logic gate to generate the multiplexer select signal according to outputs of the first and second shift register chains.

5. The apparatus of claim 1, wherein one of the circuitries of the first plurality of circuitries comprises a first combinational logic to generate a select signal.

6. The apparatus of claim 5, wherein the one of the circuitries of the first plurality of circuitries comprises a shift register chain including multiplexers controllable by the select signal.

7. The apparatus of claim 6, wherein the one of the circuitries of the first plurality of circuitries comprises a second combinational logic to generate a pulse according to the scan or functional clocks.

8. The apparatus of claim 1 wherein the second domain is an asynchronous domain.

9. A system comprising:
a memory;
a processor coupled to the memory; and
a wired and wireless interface to allow the processor to communicate with another device, wherein the processor includes an apparatus for at-speed testing of one or more circuitries, wherein the apparatus includes:
a circuitry to selectively switch between a functional clock or a scan clock;
a first plurality of circuitries to generate a plurality of pulses according to the scan or functional clocks; and
a second plurality of circuitries to generate a plurality of clocks according to the plurality of pulses, wherein the plurality of clocks are for testing the one or more circuitries,
wherein the circuitry comprises a second circuitry to generate a multiplexer select signal, and
wherein the second circuitry comprises:
a first shift register chain;
a second shift register chain; and
a logic gate to generate the multiplexer select signal according to outputs of the first and second shift register chains.

10. The system of claim 9, wherein the processor comprises logic to apply a clock from among the plurality of clocks when a first domain is being tested, and to turn off a clock from among the plurality of clocks when a second domain is an asynchronous domain.

11. The system of claim 9, wherein the circuitry comprises a multiplexer to provide one of the functional clock or the scan clock according to a logic state of the multiplexer select signal.

12. The system of claim 9, wherein the second circuitry comprises:
a first shift register chain;
a second shift register chain; and
a logic gate to generate the multiplexer select signal according to outputs of the first and second shift register chains.

13. The system of claim 9, wherein one of the circuitries of the first plurality of circuitries comprises:
a first combinational logic to generate a select signal;
a shift register chain including multiplexers controllable by the select signal; and
a second combinational logic to generate a pulse according to the scan or functional clocks.

14. A method comprising:
selectively switching between a functional clock or a scan clock;
generating a plurality of pulses according to the scan or functional clocks;
generating a plurality of clocks according to the plurality of pulses;
testing one or more circuitries using the plurality of clocks; and
turning off or gating a clock from among the plurality of clocks when a second domain is an asynchronous domain.

15. The method of claim 14 comprises applying a clock from among the plurality of clocks when a first domain is being tested.

16. The method of claim 14 comprises:
generating a multiplexer select signal; and
providing one of the functional clock or the scan clock according to a logic state of the multiplexer select signal.

17. An apparatus comprising:
a first circuitry for selectively switching between a functional clock or a scan clock;
a second circuitry for generating a plurality of pulses according to the scan or functional clocks;
a third circuitry for generating a plurality of clocks according to the plurality of pulses;
a fourth circuitry for testing one or more circuitries using the plurality of clocks; and
logic to apply a clock from among the plurality of clocks when a first domain is being tested, and to turn off a clock from among the plurality of clocks for a second domain.

18. The apparatus of claim 17 comprises:
a fifth circuitry for generating a multiplexer select signal; and
a sixth circuitry for providing one of the functional clock or the scan clock according to the multiplexer select signal.

* * * * *